US011056555B2

(12) United States Patent
Shih et al.

(10) Patent No.: US 11,056,555 B2
(45) Date of Patent: Jul. 6, 2021

(54) SEMICONDUCTOR DEVICE HAVING 3D INDUCTOR AND METHOD OF MANUFACTURING THE SAME

(71) Applicant: CHIPBOND TECHNOLOGY CORPORATION, Hsinchu (TW)

(72) Inventors: Cheng-Hung Shih, Changhua County (TW); Nian-Cih Yang, Hsinchu County (TW); Yi-Cheng Chen, Taoyuan (TW); Shang-Jan Yang, New Taipei (TW)

(73) Assignee: CHIPBOND TECHNOLOGY CORPORATION, Hsinchu (TW)

( * ) Notice: Subject to any disclaimer, the term of this patent is extended or adjusted under 35 U.S.C. 154(b) by 0 days.

(21) Appl. No.: 16/885,461

(22) Filed: May 28, 2020

(65) Prior Publication Data

US 2020/0295123 A1    Sep. 17, 2020

Related U.S. Application Data

(62) Division of application No. 16/401,736, filed on May 2, 2019.

(30) Foreign Application Priority Data

Feb. 19, 2019   (TW) .............................. 108105447.0

(51) Int. Cl.
*H01L 29/00* (2006.01)
*H01L 49/02* (2006.01)
*H01L 23/64* (2006.01)

(52) U.S. Cl.
CPC ............ *H01L 28/10* (2013.01); *H01L 23/645* (2013.01)

(58) Field of Classification Search
None
See application file for complete search history.

(56) References Cited

U.S. PATENT DOCUMENTS

| 7,417,525 | B2 * | 8/2008 | Lee | H01F 17/0033 257/E21.022 |
|---|---|---|---|---|
| 2005/0057335 | A1 * | 3/2005 | Sia | H01L 27/08 336/223 |
| 2007/0108551 | A1 * | 5/2007 | Lin | H01L 23/5227 257/531 |
| 2009/0002111 | A1 * | 1/2009 | Harrison | H01F 19/04 336/69 |

(Continued)

FOREIGN PATENT DOCUMENTS

| JP | 2002-289436 A | 10/2002 |
|---|---|---|
| JP | 2009-38297 A | 2/2009 |
| JP | 2009-246159 A | 10/2009 |

(Continued)

*Primary Examiner* — Hung K Vu
(74) *Attorney, Agent, or Firm* — Demian K. Jackson; Jackson IPG PLLC

(57) ABSTRACT

A semiconductor device having 3D inductor includes a first transverse inductor, a longitudinal inductor and a second transverse inductor. The first transverse inductor is formed on a first substrate, the second transverse inductor and the longitudinal inductor are formed on a second substrate. The second substrate is bonded to the first substrate to connect the first transverse inductor and the longitudinal inductor such that the first transverse inductor, the longitudinal inductor and the second transverse inductor compose a 3D inductor.

9 Claims, 12 Drawing Sheets

(56) References Cited

U.S. PATENT DOCUMENTS

2017/0125152 A1 5/2017 Li et al.
2017/0339791 A1* 11/2017 Adachi ............... H01F 27/2895

FOREIGN PATENT DOCUMENTS

| JP | 2012-178391 A | 9/2012 |
| JP | 2016-526284 A | 9/2016 |
| KR | 10-2014-0028394 A | 3/2014 |
| KR | 10-2016-0001626 A | 1/2016 |

* cited by examiner

SEMICONDUCTOR DEVICE HAVING 3D INDUCTOR AND METHOD OF MANUFACTURING THE SAME

CROSS REFERENCE TO RELATED APPLICATIONS

This application is a divisional application of U.S. patent application Ser. No. 16/401,736, filed on May 2, 2019, which claims priority under 35 U.S.C. § 119(a) to Patent Application No. 108105447 filed in Taiwan, Republic of China on Feb. 19, 2019, the entire contents of which are hereby incorporated by reference.

FIELD OF THE INVENTION

This invention relates to a semiconductor device, and more particularly to a semiconductor device having 3D inductor.

BACKGROUND OF THE INVENTION

Conventionally, 2D inductors are formed on a substrate of a semiconductor device. Increasing the size of the 2D inductors is required for sufficient inductance, but that also increase the size of the semiconductor device. For this reason, 2D inductors are incapable of meeting size requirements of miniaturized semiconductor device.

SUMMARY

The object of the present invention is to provide a semiconductor device having 3D inductor. Radial transverse inductors on two different substrates are connected with each other by a longitudinal inductor to form a 3D inductor.

A semiconductor device having 3D inductor of the present invention includes a first substrate, a first transverse inductor, a longitudinal inductor, a second transverse inductor and a second substrate. The first substrate includes a first conductive pad and a second conductive pad. The first transverse inductor is located on the first substrate and includes a plurality of first inductor portions. The first inductor portions are arranged on the first substrate radially and each include a first exterior end and a first interior end. One of the first inductor portions is connected to the first conductive pad, and another one of the first inductor portions is connected to the second conductive pad. The longitudinal inductor is located on the first transverse inductor and includes a supportive layer and a plurality of exterior inductor portions and interior inductor portions. The supportive layer includes a plurality of exterior openings and interior openings, the exterior and interior inductor portions are located in the exterior and interior openings, respectively. The second transverse inductor is located on the longitudinal inductor and includes an insulation layer and a plurality of second inductor portions. The insulation layer includes a plurality of openings arranged radially. The second inductor portions are located in the openings, arranged radially and each include a second exterior end and a second interior end. Both ends of each of the exterior inductor portions are connected to the first exterior end of the first inductor portions and the second exterior end of the second inductor portions, respectively. Both ends of each of the interior inductor portions are connected to the first interior end of the first inductor portions and the second interior end of the second inductor portions, respectively. The exterior and interior inductor portions connected to the same second inductor portion are connected to two of the adjacent first inductor portions, respectively. The second substrate is located on the second transverse inductor.

A method of manufacturing a semiconductor device having 3D inductor of the present invention includes steps of: forming a first transverse inductor on a first substrate, the first substrate includes a first conductive pad and a second conductive pad, the first transverse inductor includes a plurality of first inductor portions which are arranged on the first substrate radially and each include a first exterior end and a first interior end, one of the first inductor portions is connected to the first conductive pad, and another one of the first inductor portions is connected to the second conductive pad; forming a second transverse inductor on a second substrate, the second transverse inductor includes an insulation layer and a plurality of second inductor portions, the insulation layer is formed on the second substrate and includes a plurality of openings arranged radially, the second inductor portions are formed in the openings, arranged radially and each include a second exterior end and a second interior end; forming a longitudinal inductor on the second transverse inductor, the longitudinal inductor includes a supportive layer and a plurality of exterior inductor portions and interior inductor portions, the supportive layer is formed on the second transverse inductor and includes a plurality of exterior openings and interior openings, the second exterior ends and the second interior ends of the second inductor portions are exposed by the exterior openings and the interior openings, respectively, the exterior inductor portions are formed in the exterior openings to connect to the second exterior end of the second inductor portions, and the interior inductor portions are formed in the interior openings to connect to the second interior end of the second inductor portions; and bonding the longitudinal inductor and the first transverse inductor, the exterior and interior inductor portions are connected to the first exterior end and first interior end of the first inductor portions, respectively, and the exterior and interior inductor portions connected to the same second inductor portion are connected to two of the adjacent first inductor portions, respectively.

In the present invention, the first transverse inductor is formed on the first substrate, the second transverse inductor and the longitudinal inductor are formed on the second substrate. Through bonding the longitudinal inductor and the first transverse inductor, the first transverse inductor, the longitudinal inductor and the second transverse inductor compose a 3D inductor which has a higher inductance because of cross-section area increment.

DETAILED DESCRIPTION OF THE INVENTION

Figure 1:
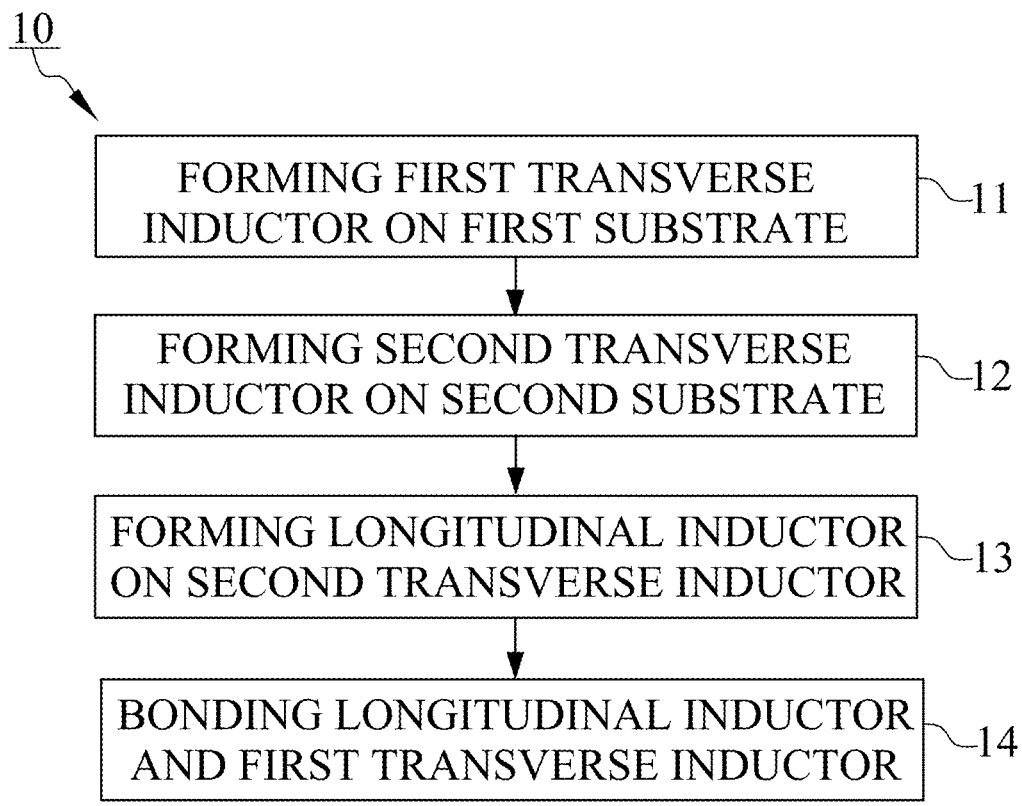
FIG. 1 is a flowchart illustrating a method of manufacturing a semiconductor device in accordance with one embodiment of the present invention.

With reference to FIG. 1, a method 10 of manufacturing a semiconductor device having 3D inductor in accordance with one embodiment of the present invention is disclosed. The method 10 includes a step 11 of forming first transverse inductor on first substrate, a step 12 of forming second transverse inductor on second substrate, a step 13 of forming longitudinal inductor on second transverse inductor and a step 14 of bonding longitudinal inductor and first transverse inductor. The steps 12 and 13 also can be processed before the step 11, the priority order of the steps 11 and 12 are not limited in the present invention.

Figure 2:
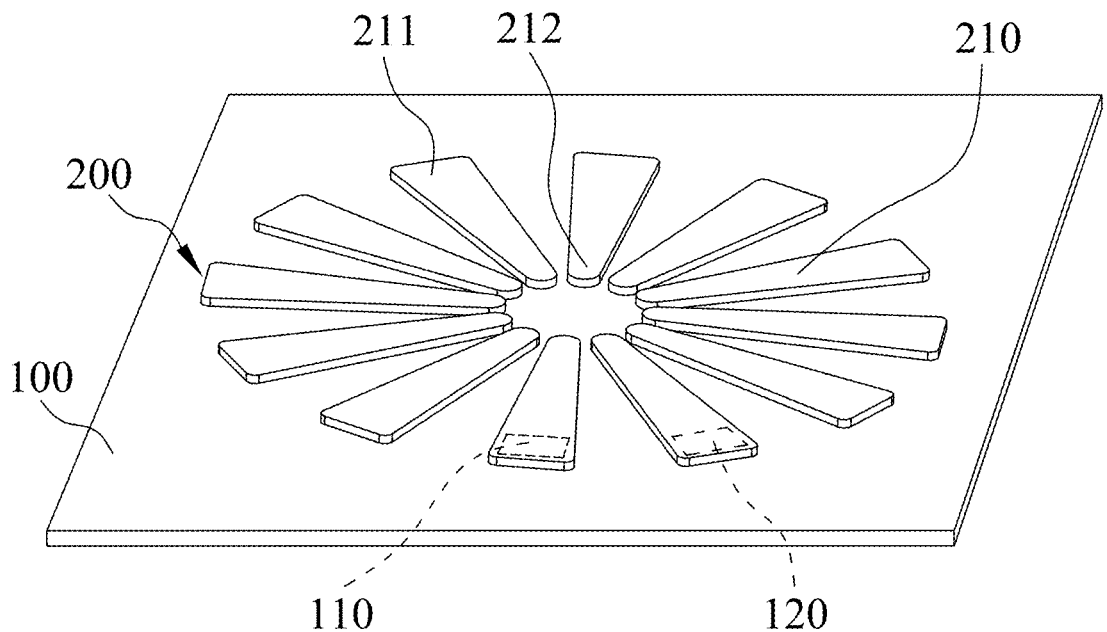
FIG. 2 is a schematic perspective diagram illustrating a method of manufacturing a semiconductor device in accordance with one embodiment of the present invention.
Figure 3:
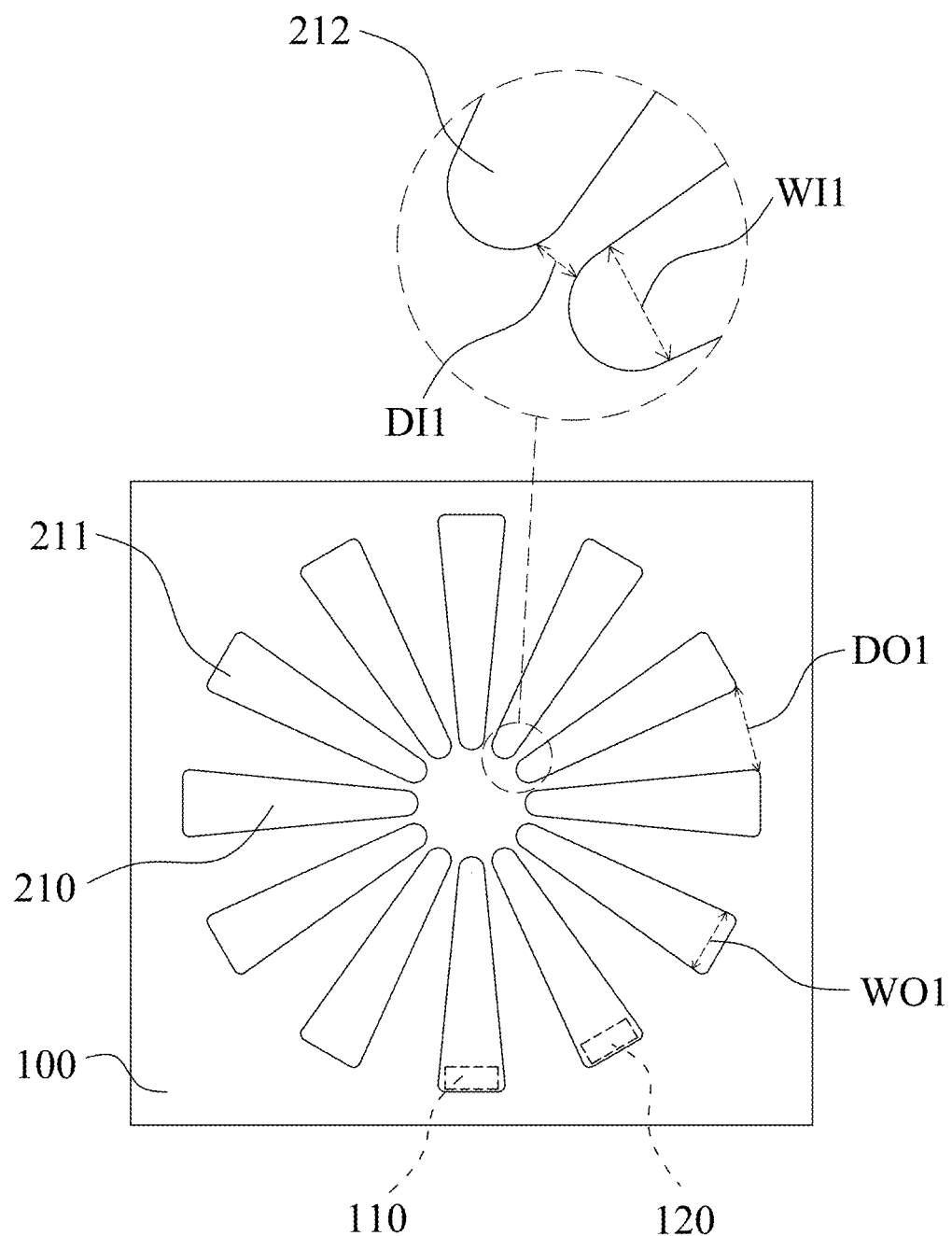
FIG. 3 is a top view diagram of FIG. 2.
Figure 5:
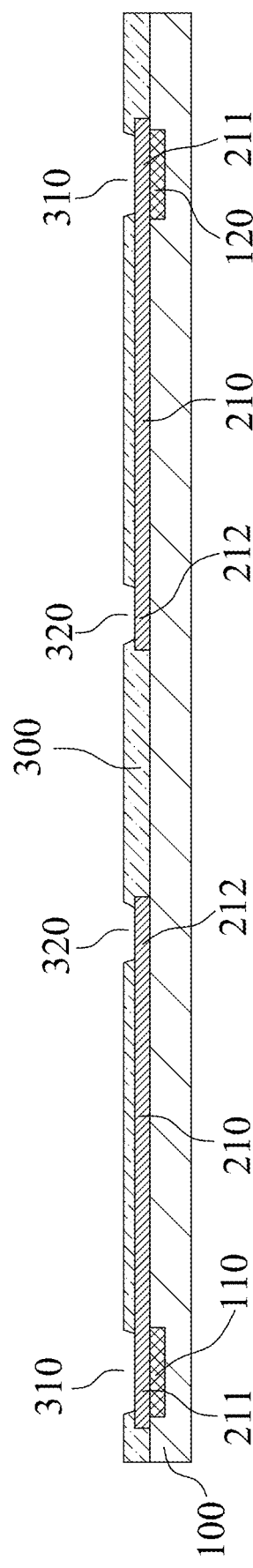
FIG. 5 is a cross-section diagram of FIG. 4 taken along line A-A.

With reference to FIGS. 2, 3 and 5, a first transverse inductor 200 is formed on a first substrate 100 firstly. The first substrate 100 includes a first conductive pad 110 and a second conductive pad 120 which are revealed on a surface of the substrate 100. The first transverse inductor 200 includes a plurality of first inductor portions 210 which are formed on the substrate 100 radially. One of the first inductor portions 210 is connected to the first conductive pad 110, and another one of the first inductor portions 210 is connected to the second conductive pad 120. The first inductor portions 210 may be formed by etching a metal layer on the first substrate 100 or depositing metals on the first substrate 100 through a patterned photoresist.

With reference to FIGS. 2 and 3, the first inductor portions 210 each include a first exterior end 211 and a first interior end 212. Preferably, a width WO1 of the first exterior end 211 is larger than a width WI1 of the first interior end 212, and a distance DO1 between two of the adjacent first exterior ends 211 is larger than a distance DI1 between two of the adjacent first interior ends 212. In this embodiment, the width of the first inductor portions 210 is decreased gradually from the first exterior end 211 to the first interior end 212.

With reference to FIGS. 2, 3 and 5, the first inductor portions 210 may be arranged on the first substrate 100 annularly and two of the adjacent first inductor portions 210 are connected to the first conductive pad 110 and the second conductive pad 120, respectively. In this embodiment, two of the adjacent first inductor portions 210 are connected to the first conductive pad 110 and the second conductive pad 120, respectively, through their first exterior ends 211.

Figure 4:
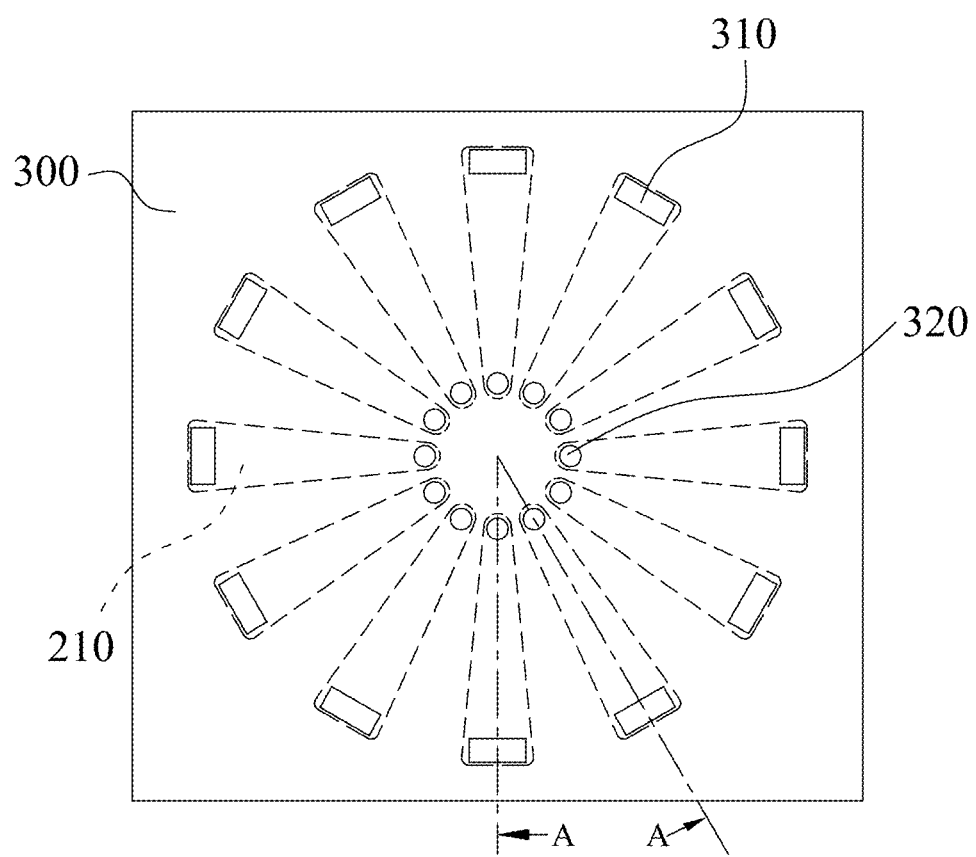
FIG. 4 is a schematic top view diagram illustrating a method of manufacturing a semiconductor device in accordance with one embodiment of the present invention.

With reference to FIGS. 4 and 5, next, a protective layer 300 may be formed on the first transverse inductor 200. The protective layer 300 is provided to cover the first substrate 100 and the first transverse inductor 200 and includes a plurality of first exposing openings 310 and second exposing openings 320. The first exterior end 211 and the first interior end 212 of the first inductor portions 210 are exposed by the first exposing openings 310 and the second exposing openings 320, respectively.

Figure 6:
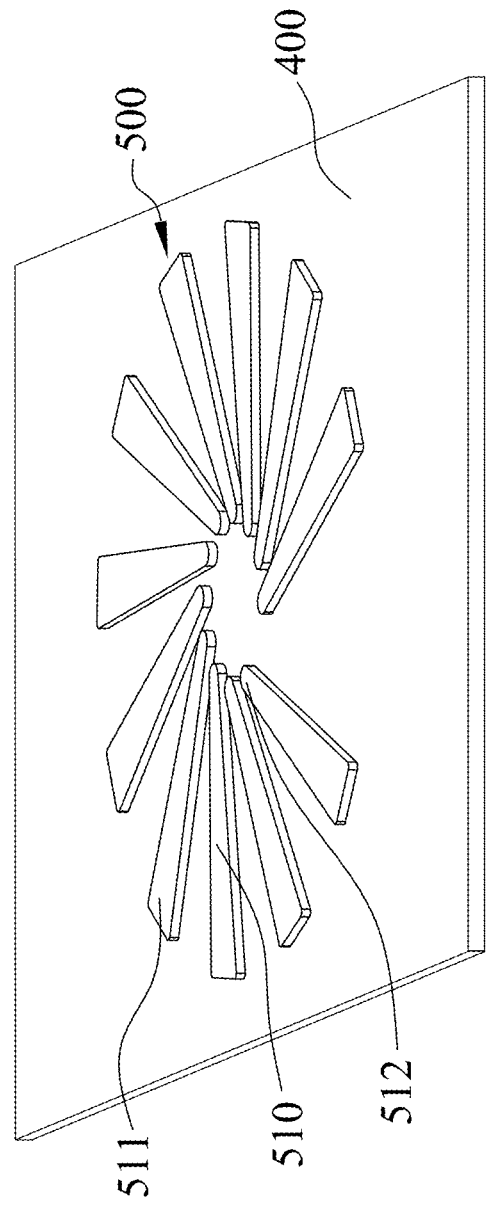
FIG. 6 is a schematic perspective diagram illustrating a method of manufacturing a semiconductor device in accordance with one embodiment of the present invention.
Figure 7:
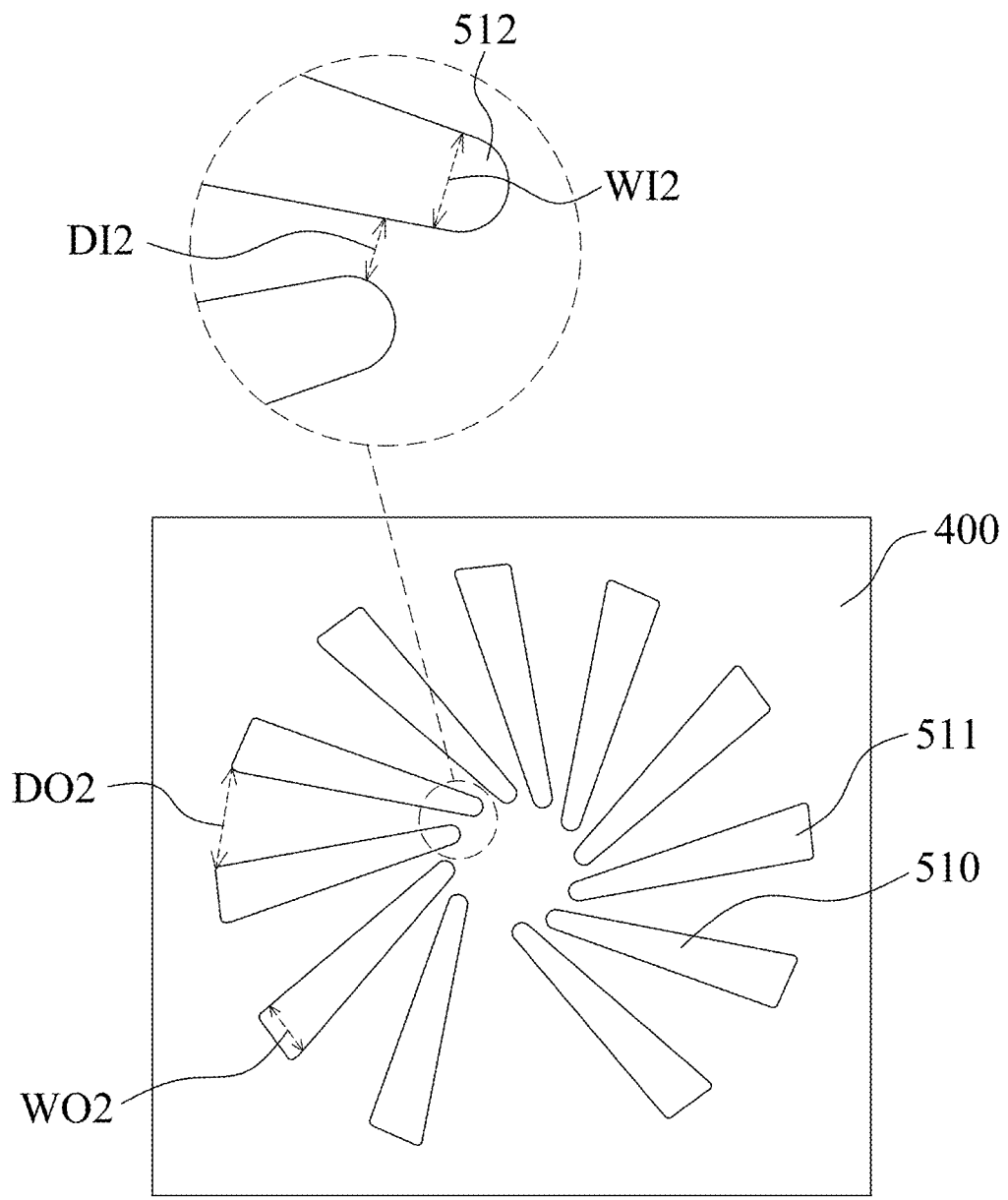
FIG. 7 is a top view diagram of FIG. 6.
Figure 8:
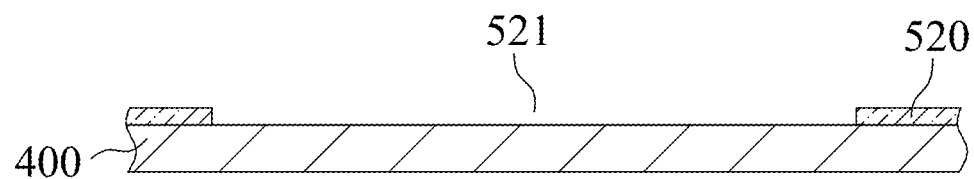
FIG. 8 is a cross-section view diagram illustrating a method of manufacturing a semiconductor device in accordance with one embodiment of the present invention.
Figure 9:
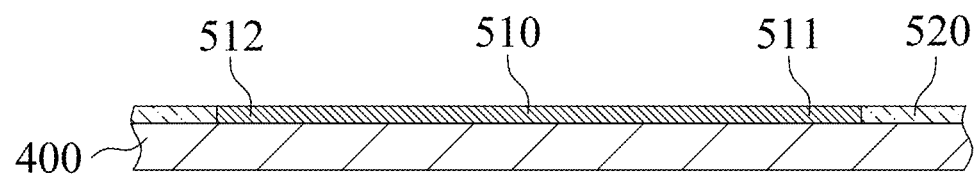
FIG. 9 is a cross-section view diagram illustrating a method of manufacturing a semiconductor device in accordance with one embodiment of the present invention.

With reference to FIGS. 6 to 9, a second transverse inductor 500 is formed on a second substrate 400. The second transverse inductor 500 includes a plurality of second inductor portions 510 and an insulation layer 520 (FIGS. 6 and 7 omit the insulation layer 520). The insulation layer 520 is formed on the second substrate 400 and has a plurality of openings 521 arranged radially. The second inductor portions 510 are formed in the openings 521, as a result, they are also arranged on the second substrate 400 radially. The insulation layer 520 may be a dry film photoresist applied to the second substrate 400, the openings 521 may be formed on the dry film photoresist through pattern process, and the second inductor portions 510 may be formed by depositing metals in the openings 521.

With reference to FIG. 7, the second inductor portions 510 each include a second exterior end 511 and a second interior end 512. Preferably, a width WO2 of the second exterior end 511 is larger than a width WI2 of the second interior end 512, and a distance DO2 between two of the adjacent second exterior ends 511 is larger than a distance DI2 between two of the adjacent second interior ends 512. In this embodiment, the width of the second inductor portions 510 is decreased gradually from the second exterior end 511 to the second interior end 512.

Figure 10:
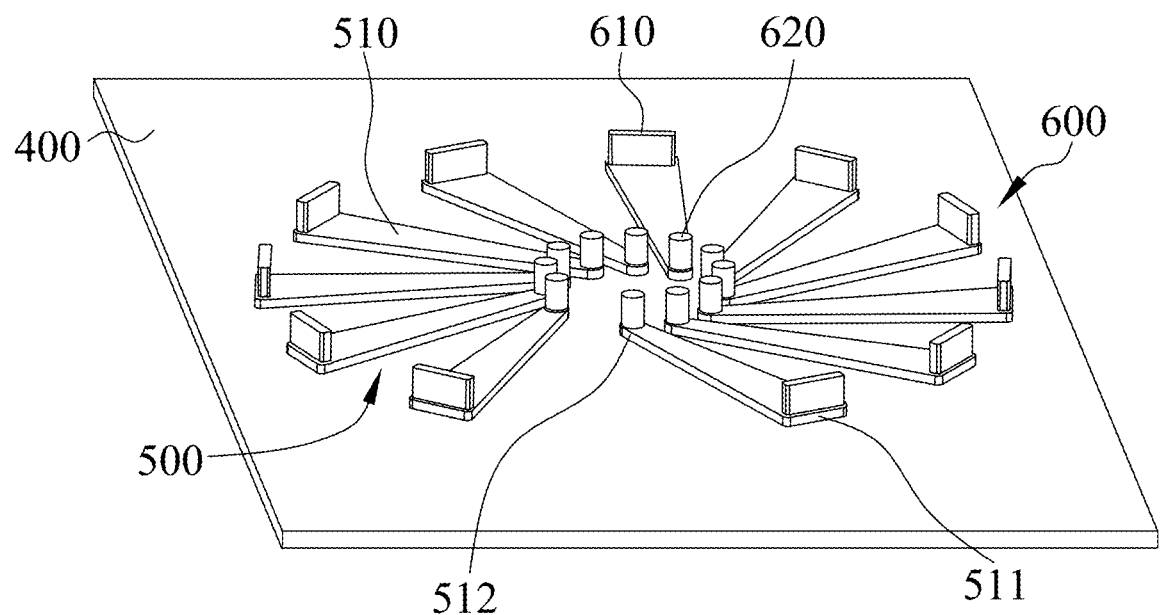
FIG. 10 is a schematic perspective diagram illustrating a method of manufacturing a semiconductor device in accordance with one embodiment of the present invention.
Figure 11:
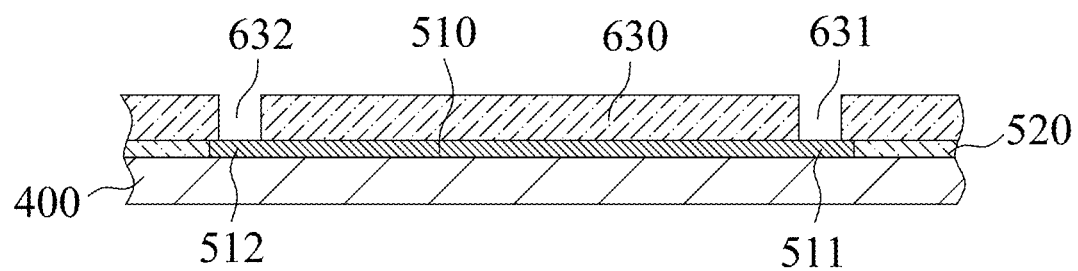
FIG. 11 is a cross-section view diagram illustrating a method of manufacturing a semiconductor device in accordance with one embodiment of the present invention.
Figure 12:
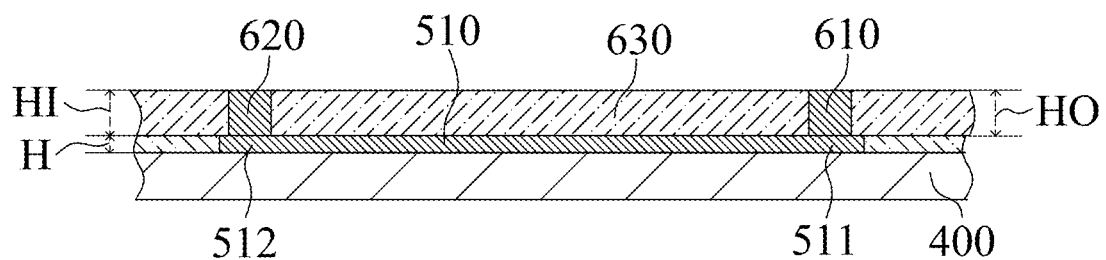
FIG. 12 is a cross-section view diagram illustrating a method of manufacturing a semiconductor device in accordance with one embodiment of the present invention.

With reference to FIGS. 10 to 12, a longitudinal inductor 600 is formed on the second transverse inductor 500 and includes a supportive layer 630 and a plurality of exterior inductor portions 610 and interior inductor portions 620. Please note that FIG. 10 omits the insulation layer 520 and the supportive layer 630. The supportive layer 630 is formed on the second transverse inductor 500 and has a plurality of exterior openings 631 and interior openings 632. The supportive layer 630 may be also a dry film photoresist applied to the second transverse inductor 500, and the exterior openings 631 and the interior openings 632 may be formed through conventional pattern process. The exterior openings 631 and the interior openings 632 expose the second exterior end 511 and the second interior end 512 of the second inductor portions 510, respectively. Through metal deposition, the exterior inductor portions 610 are formed in the exterior openings 631 to connect with the second exterior end 511 of the second inductor portions 510, and the interior inductor portions 620 are formed in the interior openings 632 at the same time to connect with the second interior end 512 of the second inductor portions 510.

With reference to FIG. 12, a height HO of the exterior inductor portions 610 is substantially equal to a height HI of the interior inductor portions 620, and the heights of the exterior inductor portions 610 and the interior inductor portions 620 are both greater than a height H of the second inductor portions 510. Preferably, the heights of the exterior inductor portions 610 and the interior inductor portions 620 range between 10 and 80 μm, and the height of the second inductor portions 510 ranges between 3 and 40 μm.

In other embodiments, the supportive layer 630 is formed by stacking two layers of dry film photoresist. First layer is applied to the second transverse inductor 500, the exterior inductor portions 610 and the interior inductor portions 620 are formed through photoresist patterning and metal deposition processes. Next, second layer is applied to the first layer and photoresist patterning and metal deposition processes are performed again such that the exterior inductor portions 610 formed in two layers are connected with each other and the interior inductor portions 620 formed in two layers are also connected with each other.

Figure 13:
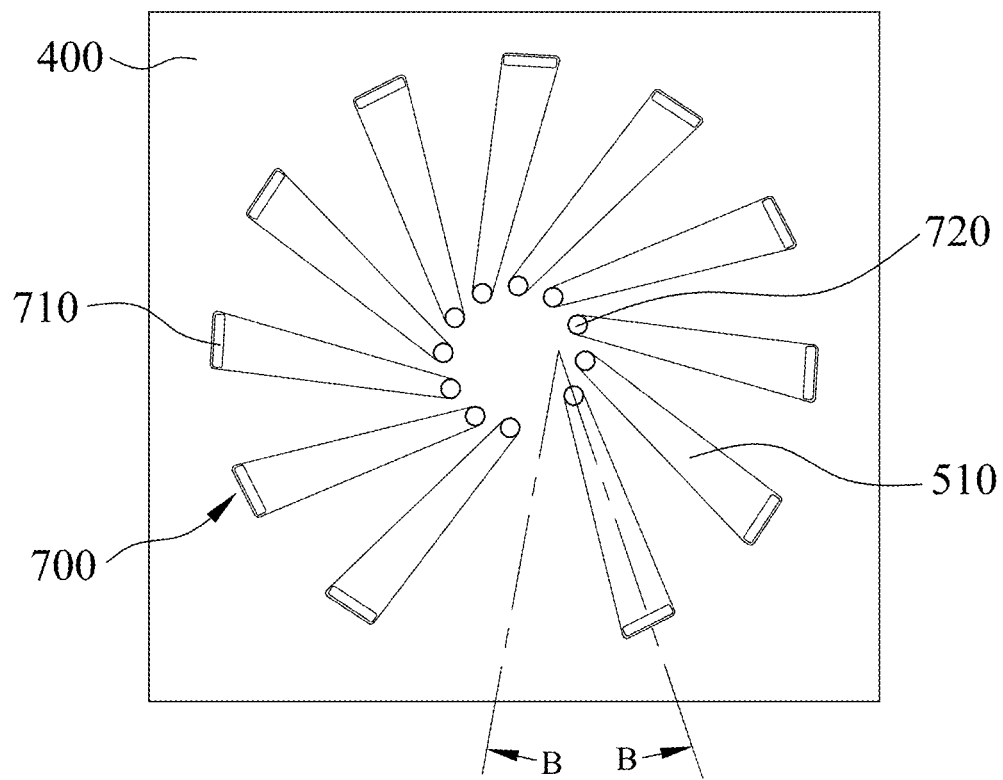
FIG. 13 is a schematic top view diagram illustrating a method of manufacturing a semiconductor device in accordance with one embodiment of the present invention.
Figure 14:
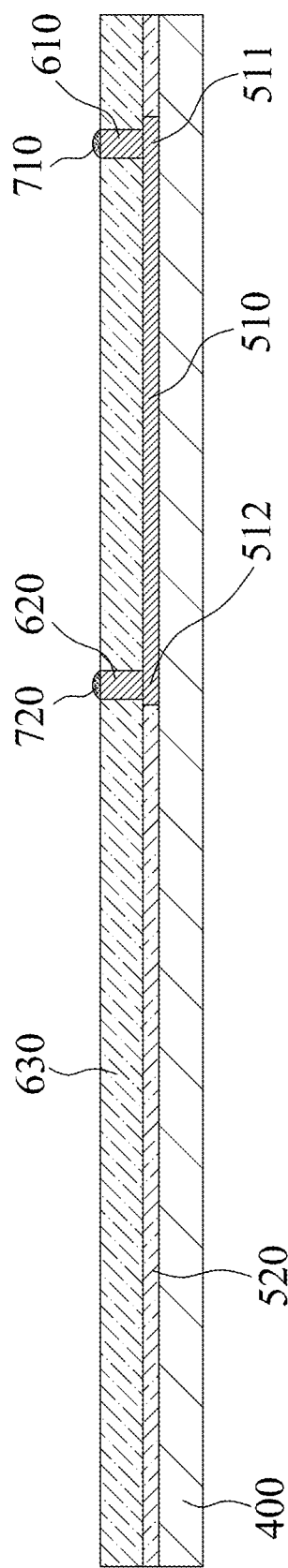
FIG. 14 is a cross-section view diagram of FIG. 13 taken along line B-B.

With reference to FIGS. 13 and 14, a solder layer 700 may be formed on the longitudinal inductor 600. The solder layer 700 includes a plurality of exterior bonding portions 710 and interior bonding portions 720. The exterior bonding portions 710 and the interior inductor portions 720 are connected to the exterior inductor portions 610 and the interior inductor portions 620, respectively.

Figure 15:
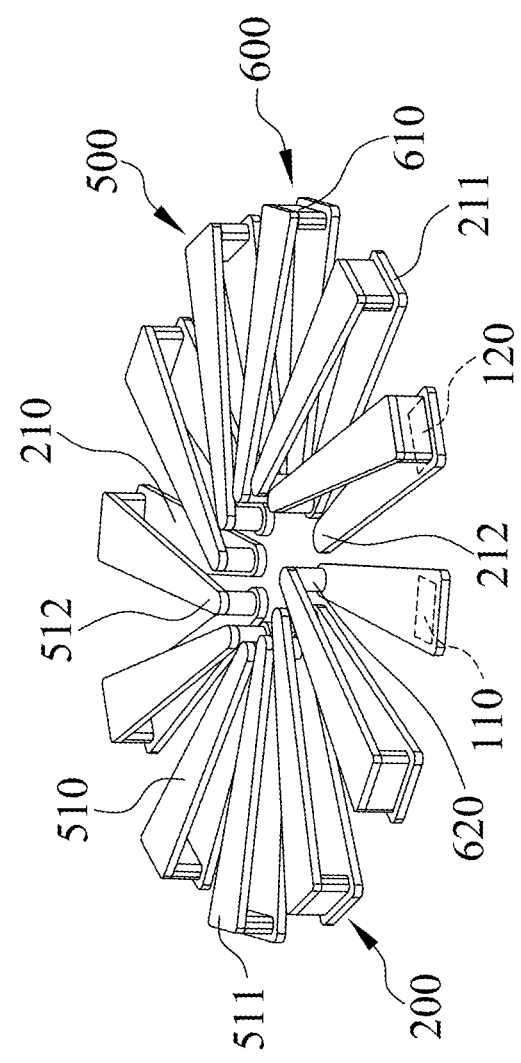
FIG. 15 is a schematic perspective diagram illustrating a method of manufacturing a semiconductor device in accordance with one embodiment of the present invention.
Figure 16:
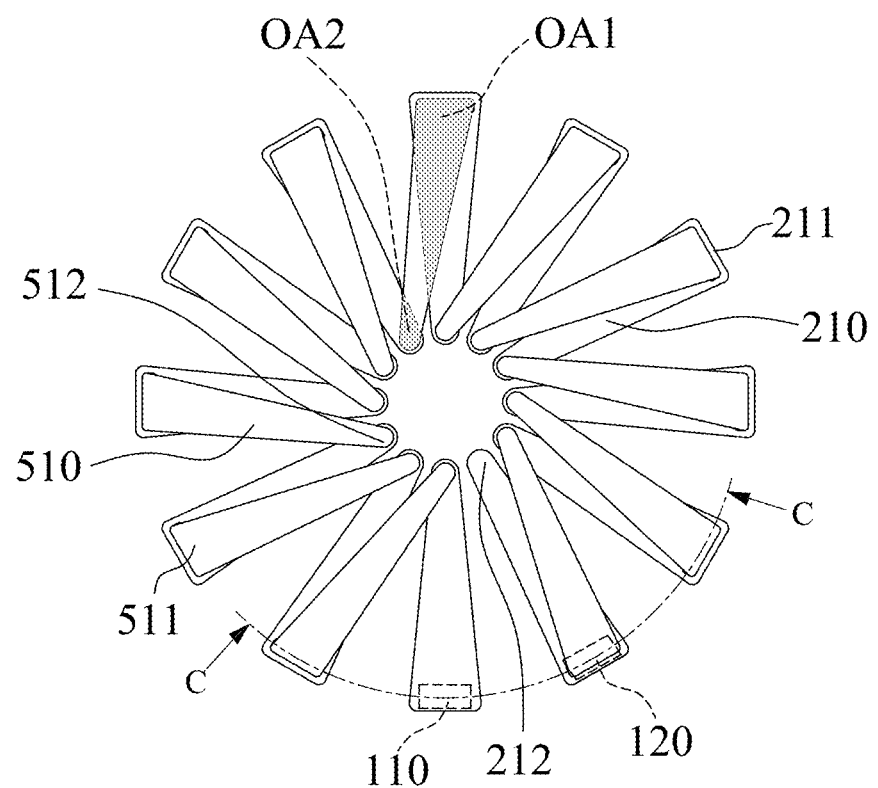
FIG. 16 is a schematic top view diagram illustrating a method of manufacturing a semiconductor device in accordance with one embodiment of the present invention.
Figure 17:
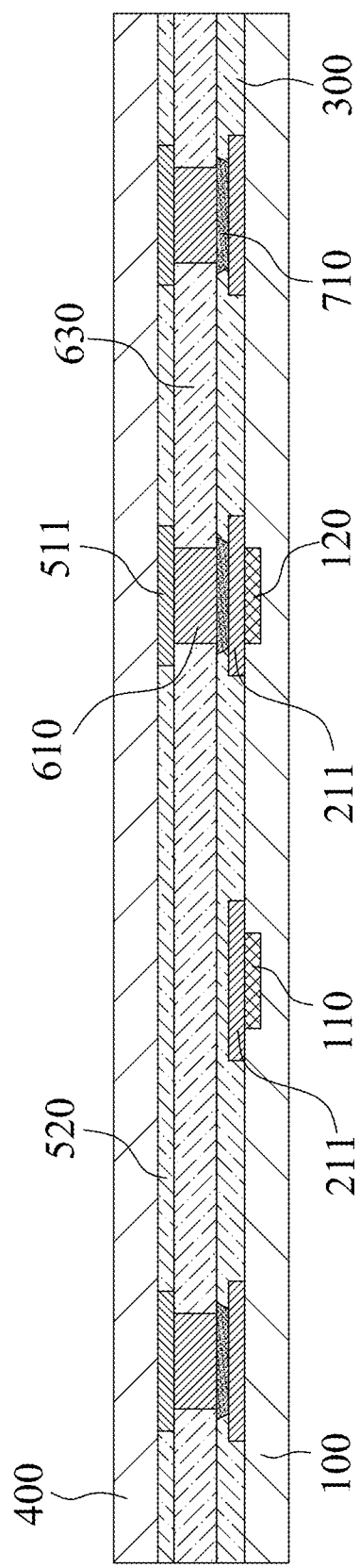
FIG. 17 is a cross-section view diagram of FIG. 16 taken along line C-C.
Figure 18:
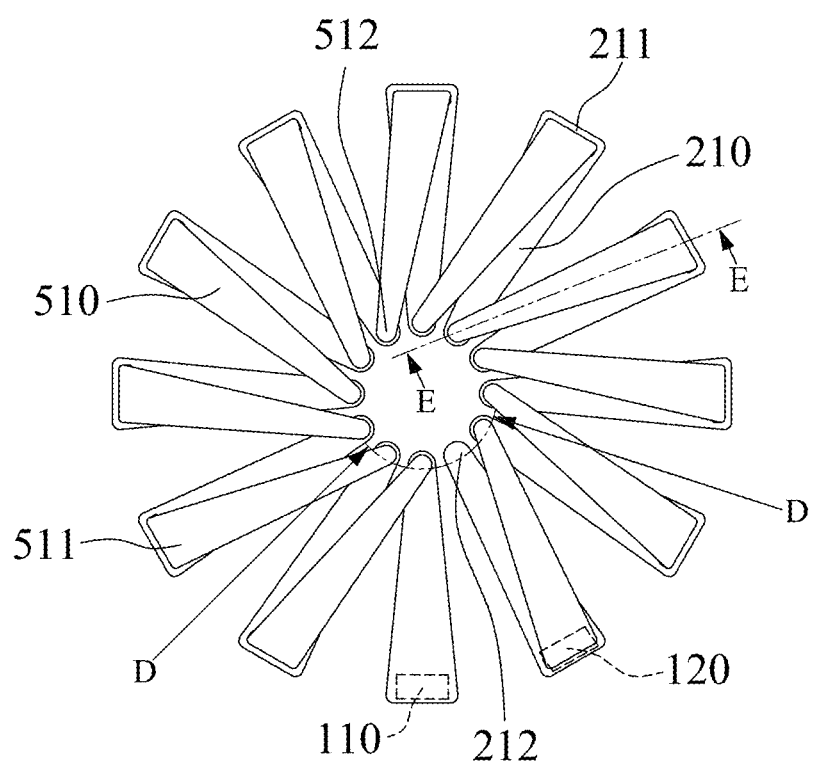
FIG. 18 is a schematic top view diagram illustrating a method of manufacturing a semiconductor device in accordance with one embodiment of the present invention.
Figure 19:
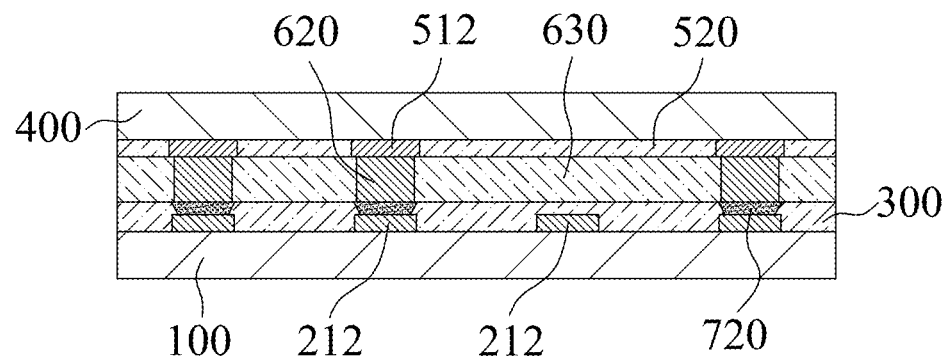
FIG. 19 is a cross-section view diagram of FIG. 18 taken along line D-D.

With reference to FIGS. 15 to 20, the second substrate 400 having the second transverse inductor 500 and the longitudinal inductor 600 is flip bonded to the first substrate 100 having the first transverse inductor 200 such that the longitudinal inductor 600 is connected with the first transverse inductor 200. Further, the exterior inductor portions 610 and the interior inductor portions 620 are connected to the first exterior end 211 and the first interior end 211 of the first inductor portions 210, respectively. Please note that FIGS. 15, 16 and 18 only show the first transverse inductor 200, the longitudinal inductor 600 and the second transverse inductor 500. Referring to FIG. 17, both ends of each of the exterior inductor portions 610 are connected to the first exterior end 211 of the first inductor portions 210 and the second exterior end 511 of the second inductor portions 510, respectively. Referring to FIG. 19, both ends of each of the interior inductor portions 620 are connected to the first interior end 212 of the first inductor portions 210 and the second interior end 512 of the second inductor portions 510, respectively.

With reference to FIG. 15, preferably, the first transverse inductor 200 has N+1 number of the first inductor portions 210, the second transverse inductor 500 has N number of second inductor portions 510, and the longitudinal inductor 600 has N number of the exterior inductor portions 610 and N number of the interior inductor portions 620. As shown in FIGS. 17 and 19, the first inductor portion 210 connected to the first conductive pad 110 is not connected to any exterior inductor portion, and the first inductor portion 210 connected to the second conductive pad 120 is not connected to any interior inductor portion. A 3D inductor consists of the first inductor portions 210 of the first transverse inductor 200, the second inductor portions 510 of the second transverse inductor 500, and the exterior inductor portions 610 and the interior inductor portions 620 of the longitudinal inductor 600. Electric current may flow from the first conductive pad 110 to the second conductive pad 120 through the first inductor portions 210, the exterior inductor portions 610, the interior inductor portions 620 and the second inductor portions 510.

With reference to FIGS. 15 and 16, an intersection of the first inductor portion 210 and the second inductor portion 510 connected to the same exterior inductor portion 610 defines a first overlap area OA1, and an intersection of the first inductor portion 210 and the second inductor portion 510 connected to the same interior inductor portion 620 defines a second overlap area OA2. The first overlap area OA1 may be larger than the second overlap area OA2.

Figure 20:
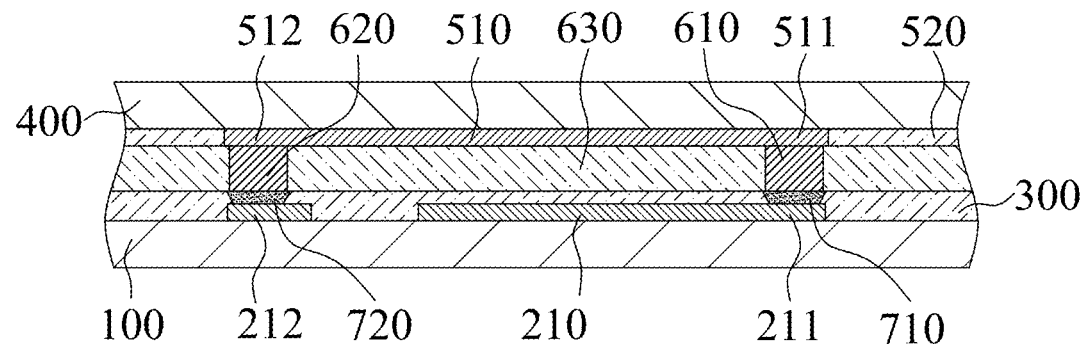
FIG. 20 is a cross-section view diagram of FIG. 18 taken along line E-E.

When the longitudinal inductor 600 is bonded to the first transverse inductor 200 by the solder layer 700, each of the exterior bonding portions 710 is configured to connect the exterior inductor portion 610 and the first exterior end 211 of the first inductor portion 210 (as shown in FIG. 17), each of the interior bonding portions 720 is configured to connect the interior inductor portion 620 and the first interior end 212 of the first inductor portion 210 (as shown in FIG. 19), and the exterior inductor 610 and the interior inductor portion 620 connected to the same second inductor portion 510 are connected to two of the adjacent first inductor portions 210, respectively (as shown in FIG. 20).

With reference to FIGS. 15, 17 and 19, a semiconductor device having 3D inductor is manufactured by the method 10 of the present invention. The semiconductor device includes the first substrate 100, the first transverse inductor 200 located on the first substrate 100, the longitudinal inductor 600 located on the first transverse inductor 200, the second transverse inductor 500 located on the longitudinal inductor 600, and the second substrate 400 located on the second transverse inductor 500. The protective layer 300 may be located between the first substrate 100 and the longitudinal inductor 600.

In this embodiment, the first substrate 100 and the second substrate 400 are a circuit chip and a silicon wafer, respectively. A plurality of second transverse inductors 500 and longitudinal inductors 600 are formed on the silicon wafer. Through grinding and sawing processes, the silicon wafer becomes a plurality of units having one second transverse inductor 500 and one longitudinal inductor 600. The semiconductor device having 3D inductor is formed by bonding the longitudinal inductor 600 to the first transverse inductor 200.

The longitudinal inductor on one substrate is bonded to the transverse inductor arranged on another substrate radially to form the 3D inductor through semiconductor bonding process such that miniaturized semiconductor device can have higher inductance.

While this invention has been particularly illustrated and described in detail with respect to the preferred embodiments thereof, it will be clearly understood by those skilled in the art that is not limited to the specific features shown and described and various modified and changed in form and details may be made without departing from the spirit and scope of this invention.

What is claimed is:

1. A method of manufacturing a semiconductor device, comprising:

forming a first transverse inductor on a first substrate, the first substrate includes a first conductive pad and a second conductive pad, the first transverse inductor includes a plurality of first inductor portions which are formed on the first substrate radially and each include a first exterior end and a first interior end, wherein one of the first inductor portions is connected to the first conductive pad and another one of the first inductor portions is connected to the second conductive pad;

forming a second transverse inductor on a second substrate, the second transverse inductor includes an insulation layer and a plurality of second inductor portions, the insulation layer is formed on the second substrate and includes a plurality of openings arranged radially, the second inductor portions are formed in the openings, arranged radially and each include a second exterior end and a second interior end;

forming a longitudinal inductor on the second transverse inductor, the longitudinal inductor includes a supportive layer, a plurality of exterior inductor portions and a plurality of interior inductor portions, the supportive layer is formed on the second transverse inductor and includes a plurality of exterior openings and a plurality of interior openings, the second exterior end and the second interior end of the second inductor portions are exposed by the exterior openings and the interior openings, respectively, the exterior inductor portions are formed in the exterior openings to connect to the second exterior end of the second inductor portions, and the interior inductor portions are formed in the interior openings to connect to the second interior end of the second inductor portions; and bonding the longitudinal inductor and the first transverse inductor, the exterior inductor portions and the interior inductor portions are connected to the first exterior end and the first interior end of the first inductor portions, respectively, wherein the exterior and interior inductor portions connected to the same second inductor portion are connected to two of the adjacent first inductor portions, respectively.

2. The manufacturing method in accordance with claim 1, wherein two of the adjacent first inductor portions are connected to the first and second conductive pads, respectively.

3. The manufacturing method in accordance with claim 1, wherein two of the adjacent first inductor portions are connected to the first and second conductive pads, respectively, through the first exterior end.

4. The manufacturing method in accordance with claim 1, wherein an intersection of the first and second inductor portions connected to the same exterior inductor portion defines a first overlap area, an intersection of the first and second inductor portions connected to the same interior inductor portion defines a second overlap area, and the first overlap area is larger than the second overlap area.

5. The manufacturing method in accordance with claim 1, wherein a width of the first exterior end is larger than a width of the first interior end, and a width of the second exterior end is larger than a width of the second interior end.

6. The manufacturing method in accordance with claim 1, wherein a distance between the first exterior ends of two of the adjacent first inductor portions is larger than a distance between the first interior ends of two of the adjacent first inductor portions.

7. The manufacturing method in accordance with claim 1, wherein a height of the exterior inductor portions is substantially equal to a height of the interior inductor portions and higher than a height of the second inductor portions.

8. The manufacturing method in accordance with claim 1, wherein a solder layer is formed on the longitudinal inductor after forming the longitudinal inductor, the solder layer includes a plurality of exterior bonding portions and a plurality of interior bonding portions, wherein when bonding the longitudinal inductor and the first transverse inductor, the exterior bonding portions are configured to connect the exterior inductor portions and the first exterior end of the first inductor portions, and the interior bonding portions are configured to connect the interior inductor portions and the first interior end of the first inductor portions.

9. The manufacturing method in accordance with claim 1, wherein a protective layer is formed on the first transverse inductor after forming the first transverse inductor, the protective layer includes a plurality of first exposing openings and a plurality of second exposing openings, the first exterior end and the first interior end of the first inductor portions are exposed by the first exposing openings and the second exposing openings, respectively.

* * * * *